United States Patent
Tao

(10) Patent No.: US 10,072,345 B2
(45) Date of Patent: Sep. 11, 2018

(54) SYSTEM AND METHOD FOR ELECTROREFINING OF SILICON

(71) Applicant: Meng Tao, Scottsdale, AZ (US)

(72) Inventor: Meng Tao, Scottsdale, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 584 days.

(21) Appl. No.: 14/551,747

(22) Filed: Nov. 24, 2014

(65) Prior Publication Data

US 2015/0075994 A1   Mar. 19, 2015

Related U.S. Application Data

(63) Continuation of application No. PCT/US2013/047775, filed on Jun. 26, 2013.

(60) Provisional application No. 61/665,155, filed on Jun. 27, 2012.

(51) Int. Cl.
| | |
|---|---|
| *C25C 1/22* | (2006.01) |
| *C25B 1/00* | (2006.01) |
| *C25C 1/02* | (2006.01) |
| *C01B 33/037* | (2006.01) |
| *H01L 31/18* | (2006.01) |
| *C25C 7/00* | (2006.01) |

(52) U.S. Cl.
CPC .............. *C25C 1/02* (2013.01); *C01B 33/037* (2013.01); *C25B 1/006* (2013.01); *C25C 7/00* (2013.01); *H01L 31/182* (2013.01); *Y02E 10/546* (2013.01); *Y02P 70/521* (2015.11)

(58) Field of Classification Search
CPC .............................. C25B 1/006; C01B 33/037
See application file for complete search history.

(56) References Cited

U.S. PATENT DOCUMENTS

| | | | |
|---|---|---|---|
| 3,990,953 A | 11/1976 | Austin | |
| 4,142,947 A | 3/1979 | Cohen | |
| 4,448,651 A * | 5/1984 | Olson | ............... C25B 1/006 136/258 |
| 4,588,485 A * | 5/1986 | Cohen | ............... C25C 3/00 204/245 |
| 4,662,998 A | 5/1987 | Stern | |
| 4,923,579 A * | 5/1990 | Snyder | ............... C25C 3/34 205/230 |
| 5,378,325 A | 1/1995 | Dastolfo | |
| 5,976,345 A | 11/1999 | Pal | |

(Continued)

OTHER PUBLICATIONS

Metrohm Autolab Application Note EC08 "Basic Overview of the Working Principle of a Potentiostat/Galvanostat (PGSTAT)—Electrochemical Cell Setup" (Dec. 2011).*

(Continued)

*Primary Examiner* — Bryan D. Ripa
(74) *Attorney, Agent, or Firm* — Snell & Wilmer L.L.P.

(57) ABSTRACT

The present disclosure provides methods and systems for electrorefining high-purity materials, for example, silicon. An exemplary system includes at least one cathode, an anode, and a reference electrode. At least one controller, for example a potentiostat, is used to control the potential difference between a reference electrode and a cathode or anode. The system can be operated in a single phase or multiple phase operation to produce high-purity materials, such as solar-grade silicon.

11 Claims, 11 Drawing Sheets

(56) References Cited

U.S. PATENT DOCUMENTS

| | | | |
|---|---|---|---|
| 6,896,788 B2* | 5/2005 | Shindo | C25C 1/00 |
| | | | 205/560 |
| 7,101,470 B2* | 9/2006 | Stubergh | C25C 3/36 |
| | | | 205/364 |
| 7,169,285 B1 | 1/2007 | O'Grady | |
| 9,039,885 B1* | 5/2015 | Holland | C25B 1/24 |
| | | | 204/246 |
| 2009/0127125 A1 | 5/2009 | Dobberstein | |
| 2010/0258448 A1* | 10/2010 | Whitehead | C22B 3/24 |
| | | | 205/538 |
| 2010/0276297 A1* | 11/2010 | Powell, IV | C25B 1/006 |
| | | | 205/350 |

OTHER PUBLICATIONS

Rao et al., "Electrowinning of Silicon from K2Si¬¬¬F¬¬6-Molten Fluoride Systems" J. Electrochem. Soc. pp. 1940-1944 (1980).*

Non-final office action dated Dec. 15, 2016 in U.S. Appl. No. 14/933,274.

International Search Report and the Written Opinion of the International Searching Authority, PCT/US2013/047775 dated Sep. 5, 2013.

International Preliminary Report on Patentability, PCT/US2013/047775 dated Jan. 8, 2015.

Non-Final Rejection dated Apr. 3, 2017 in U.S. Appl. No. 14/933,274.

* cited by examiner

SYSTEM AND METHOD FOR ELECTROREFINING OF SILICON

CROSS REFERENCE TO RELATED APPLICATIONS

This application is a continuation of PCT Application No. US2013/047775 having an international filing date of Jun. 26, 2013, now published as International Publication No. WO 2014/004610 entitled "SYSTEM AND METHOD FOR ELECTROREFINING OF SILICON". PCT Application No. US2013/047775 claims priority to U.S. Provisional Application No. 61/665,155 filed on Jun. 27, 2012 and entitled "SYSTEM AND METHOD FOR ELECTROREFINING OF SILICON." The entire contents of all the foregoing applications are hereby incorporated by reference.

FEDERALLY SPONSORED RESEARCH OR DEVELOPMENT

This invention was made with government support under grant number DE-SC0008862 awarded by the Department of Energy. The government has certain rights in the invention.

TECHNICAL FIELD

The present disclosure generally relates to systems and methods for refining silicon. More particularly, the present disclosure relates to systems and methods of electrorefining high-purity silicon, for example using a multi-electrode electrorefining apparatus.

BACKGROUND

Conventional refining of high-purity silicon is highly energy-intensive. For example, producing silicon of sufficiently high-purity for use in solar cells, semiconductor devices, and computer chips requires a very high amount of electrical energy. Such high energy demand creates significant costs, and in many instances, makes it prohibitively expensive to refine sufficiently high-purity silicon.

For example, the Siemens method of producing high-purity silicon comprises reducing trichlorosilane to polycrystalline silicon, which occurs by decomposing trichlorosilane on high-purity silicon rods or plates. This process is accomplished at greater than 1000° C., and utilizes water cooling to reduce the temperature of the reactor wall. As such, it requires a very high amount of electrical energy, and consequently, significantly high energy costs.

Because of the high cost associated with producing sufficiently high-quality silicon, there exists a need for systems and methods which use less electrical energy or otherwise offer additional advantages over prior approaches. Accordingly, systems and methods to refine silicon in a more energy efficient way, such as reducing the amount of electrical energy required to refine silicon, are desired.

SUMMARY

The present disclosure provides improved systems and methods for the refining of high-purity materials, such as solar-grade silicon. In an embodiment, a system for electrorefining of silicon comprises an anode, a first cathode, and a reference electrode. Each of the anode, the first cathode, and the reference electrode are coupleable to an electrolyte. The system further comprises a controller configured to control the electrical potential between a reference electrode and at least one of the anode or the first cathode.

In another embodiment, a method for electrorefining of silicon comprises providing a system comprising an anode, a cathode, a reference electrode, an electrolyte, and a controller; applying an electrical potential between the reference electrode and the anode to cause silicon to dissolve from the anode into the electrolyte; and applying an electrical current between the anode and the cathode to cause silicon to deposit from the electrolyte onto the cathode.

In another embodiment, a method for electrorefining of silicon comprises applying a first electrical potential between a silicon-containing anode and a reference electrode to cause silicon to dissolve from the anode into an electrolyte. The electrolyte couples the anode and the reference electrode. The method further comprises applying a first electrical current between the anode and a first cathode to cause silicon to deposit from the electrolyte onto the first cathode; decoupling the anode from the electrolyte; coupling a second cathode to the electrolyte; applying a second electrical potential between the second cathode and the reference electrode to cause silicon to dissolve from the first cathode into the electrolyte; and applying a second electrical current between the first cathode and the second cathode to cause silicon to deposit from the electrolyte onto the second cathode.

BRIEF DESCRIPTION OF THE DRAWINGS

The drawing figures described herein are for illustration purposes only and are not intended to limit the scope of the present disclosure in any way. The present disclosure will become more fully understood from the detailed description and the accompanying drawing figures herein, wherein.

It will be appreciated that elements in the figures are illustrated for simplicity and clarity and have not necessarily been drawn to scale. For example, the dimensions of some of the elements in the figures may be exaggerated relative to other elements to help to improve understanding of illustrated embodiments of the present disclosure.

DETAILED DESCRIPTION

The detailed description of various embodiments herein makes reference to the accompanying drawing figures, which show various embodiments and implementations thereof by way of illustration and best mode, and not of limitation. While these embodiments are described in sufficient detail to enable those skilled in the art to practice the embodiments, it should be understood that other embodiments may be realized and that mechanical and other changes may be made without departing from the spirit and scope of the present disclosure.

Also, any reference to attached, fixed, connected or the like may include permanent, removable, temporary, partial, full and/or any other possible attachment option. Additionally, though the various embodiments discussed herein may be carried out in the context of electrorefining, for example electrorefining of silicon, it should be understood that systems and methods disclosed herein may be incorporated into other systems to refine high-purity materials, for example silicon, in accordance with principles of the present disclosure.

The various embodiments of an exemplary system, including at least one anode, at least one cathode, at least one reference electrode, and at least one system control comprise exemplary features hereinafter described. The following description and the annexed drawing figures set forth in detail and demonstrate certain illustrative embodiments of the disclosure. However, these embodiments are indicative of but a few of the various ways in which the principles disclosed herein may be employed. Other objects, advantages and novel features will become apparent from the following detailed description when considered in conjunction with the figures.

Figure 1A:
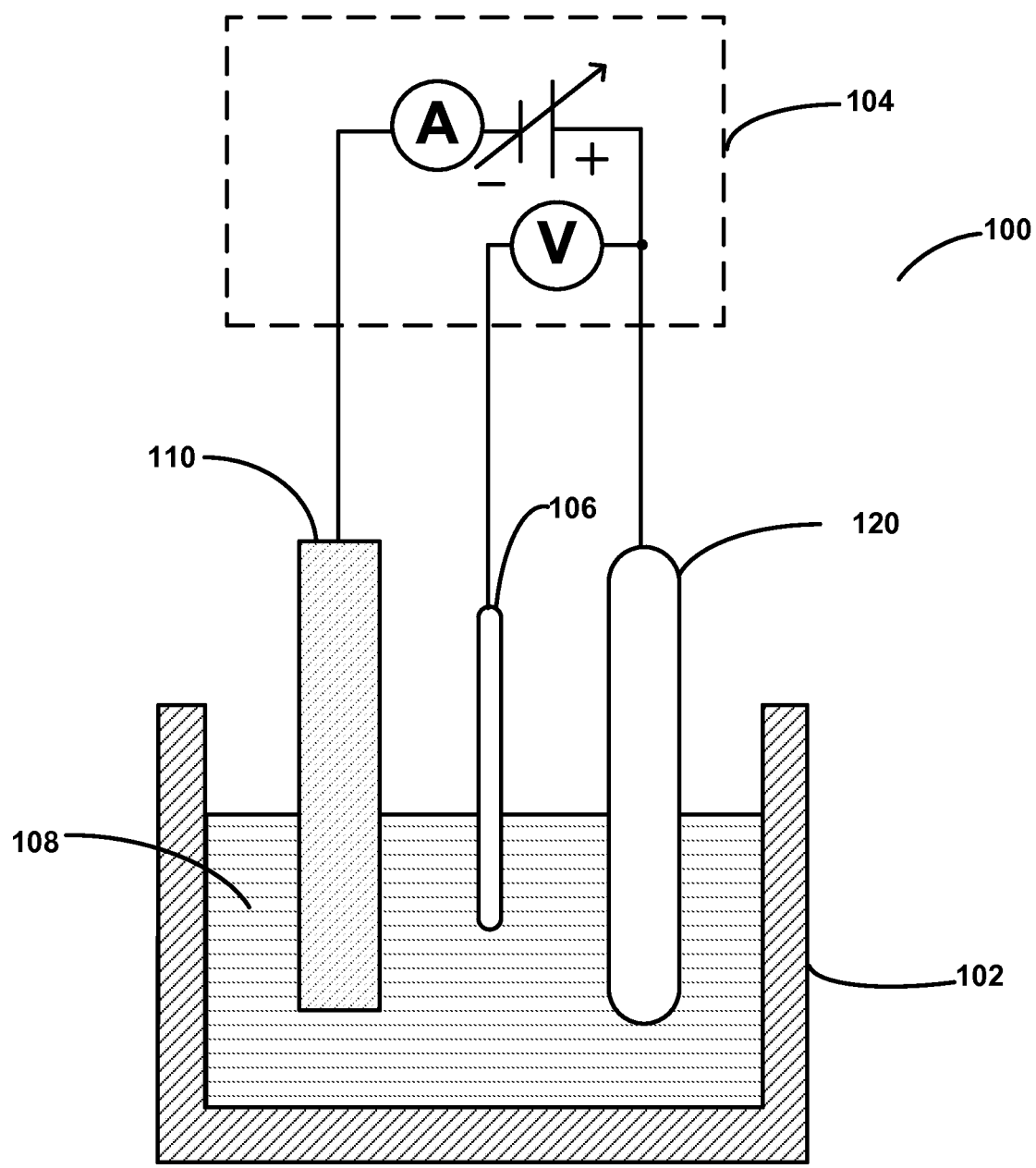
FIGS. 1A and 1B illustrate an exemplary electrorefining system in accordance with an exemplary embodiment.
Figure 1B:
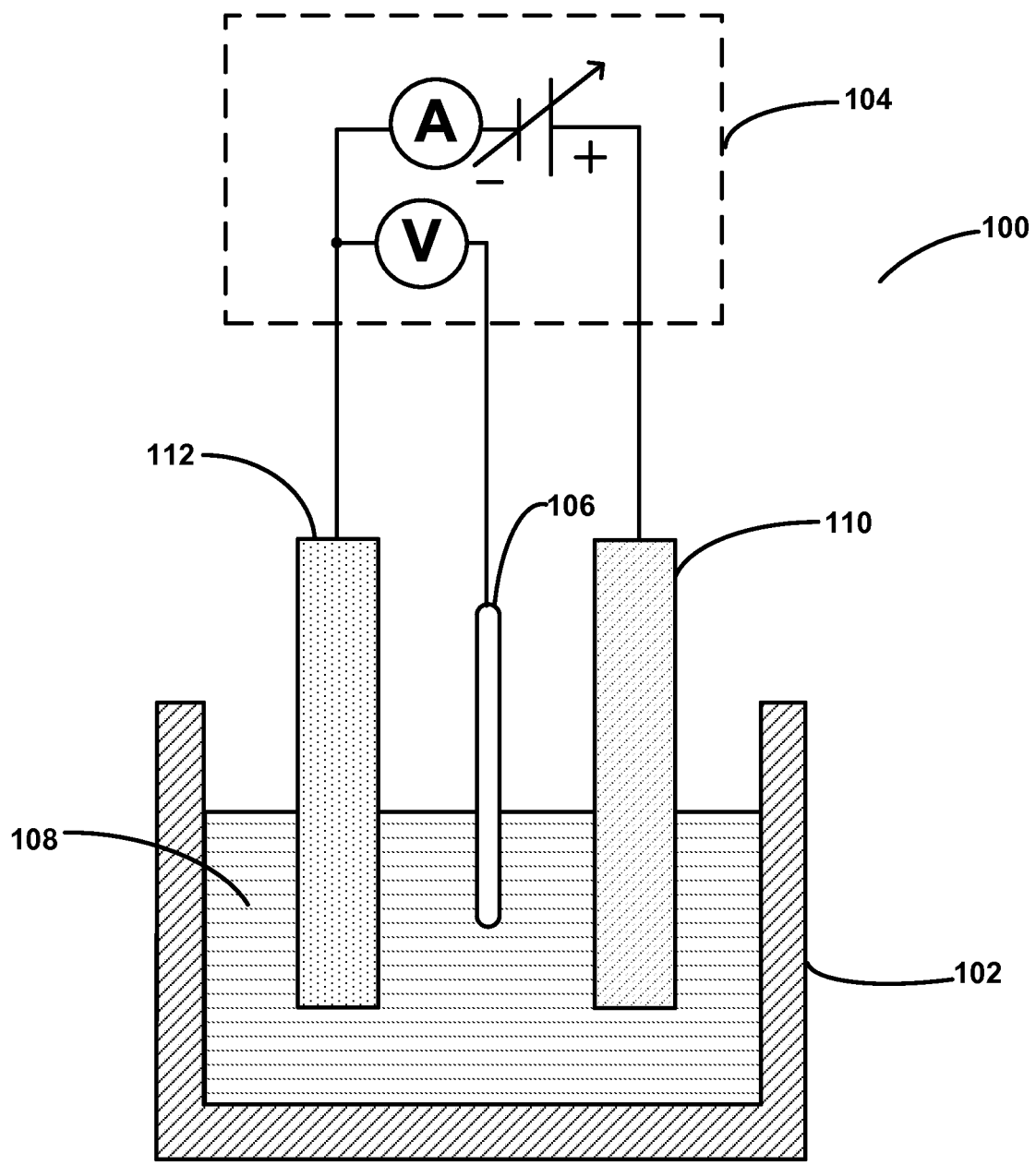

Systems and methods in accordance with principles of the present disclosure provide the ability to refine certain high-purity materials, for example solar grade silicon. To assist in understanding the context of the present disclosure, an exemplary high-purity silicon electrorefining system 100 in accordance with the present disclosure is illustrated in FIGS. 1A and 1B. It will be appreciated that, while various principles of the present disclosure are discussed herein with respect to electrorefining of silicon, principles of the present disclosure may suitably be applied to electrorefining of various other materials, such as, for example, copper or aluminum.

In various embodiments, electrorefining system 100 comprises a vessel 102. Vessel 102 can be configured to contain a number of electrodes, each of the electrodes in contact with an electrolyte 108. Vessel 102 can comprise, for example, a metallic and/or non-metallic material configured to facilitate an electrorefining operation. In various embodiments, vessel 102 comprises a glassy carbon crucible; however, any suitable material for vessel 102 may be utilized.

System 100 can further comprise an electrolyte 108. Electrolyte 108 can comprise, for example, an electrically-conductive molten salt. In various embodiments, electrolyte 108 comprises a cation with a more negative standard reduction potential than silicon, for example potassium, magnesium, calcium, sodium, barium, and/or lithium. However, any cation that is suitable for use as a component of an electrolyte in the electrorefining of silicon is within the scope of the present disclosure.

In various exemplary embodiments, electrolyte 108 can further comprise an anion with an acceptably low cost and capable of forming a stable ionic bond with a cation. For example, chlorine, fluorine, and oxygen are widely used in industrial electrorefining processes and can be provided at a relatively low cost. In certain embodiments, chlorine and fluorine are preferable to oxygen as oxygen may form silicon dioxide on the surface of electrodes, which may lead to reduced performance of the electrode. However, any anion that is suitable for use as a component of an electrolyte in the electrorefining of silicon is within the scope of the present disclosure.

Because higher operating temperatures of an electrorefining system require higher electrical energy, and electrorefining systems operate more effectively at lower operating temperatures, electrolyte 108 can comprise, in various embodiments, a molten salt with a suitably low melting point. For example, a number of potential molten salt electrolytes 108 comprise salts which melt at temperatures less than 900° C., such as $CaCl_2$ (melting point 817° C.) and LiF (melting point 848° C.). In various embodiments, electrolyte 108 comprises LiCl, which has a melting point of approximately 610° C., a cation (Li) with a more negative standard reduction potential than silicon, and a relatively low cost, non-oxygen anion (Cl). However, any molten salt with a suitably low melting point that facilitates electrorefining of silicon is within the scope of the present disclosure.

In various embodiments, electrorefining system 100 further comprises at least one cathode 110. Cathode 110 can comprise, for example, a high-purity silicon sheet or rod. In such configurations, silicon deposits on the surface of cathode 110 responsive to electrical energy being applied to electrorefining system 100. In other embodiments, cathode 110 can comprise a non-silicon metal, such as tungsten. However, at higher operating temperatures (for example, at or greater than 600° C.), silicon can form silicides with metals such as tungsten. Therefore, in electrorefining systems operating at temperatures greater than 600° C., it is preferable for cathode 110 to comprise high-purity silicon. In various exemplary embodiments, systems and/or methods in accordance with principles of the present disclosure are operable over temperatures ranging from about 600° C. to about 1500° C.

Electrorefining system 100 can further comprise an anode 120. In various embodiments, anode 120 can comprise a silicon-containing compound which dissolves as electrical energy is applied to electrorefining system 100. In such configurations, electrical energy applied to electrorefining system 100 causes silicon from the anode to dissolve into electrolyte 108. The dissolved silicon is then free to travel throughout the electrolyte.

Anode 120 can comprise, for example, a rod or sheet of metallurgical-grade silicon. In other embodiments, anode 120 comprises an alloy, such as silicon and copper. However, any silicon-containing compound which is capable of dissolving when electrical energy is applied is within the scope of the present disclosure.

In various embodiments, electrorefining system 100 can further comprise a reference electrode 106. For example, reference electrode 106 can comprise a relatively inert and/or stable material with a known standard reduction potential. In certain embodiments, reference electrode 106 is comprised of at least one of glassy carbon or platinum. Reference electrode 106 can be configured to measure the potential difference between reference electrode 106 and either the cathode 110 or the anode 120.

Electrorefining system 100 can further comprise a control system 104. Control system 104 can be configured, for example, to adjust the electrical potential and/or current provided to electrorefining system 100 (or a portion thereof) by a power source. In various embodiments, control system 104 comprises a potentiostat. In such embodiments, control system 104 can maintain the potential difference between reference electrode 106 and cathode 110 or anode 120, and can adjust the current provided between cathode 110 and anode 120 to maintain a desired electrical potential. It will be appreciated that in various exemplary embodiments, control system 104 is designed to control the voltage between a reference electrode and an anode (or cathode). In various exemplary embodiments, minimal and/or no electrical current flows through the reference electrode; rather, current flows between anode and cathode. Accordingly, in various exemplary embodiments, as the voltage applied to the anode is controlled, the voltage on the cathode may be adjusted by control system 104 (e.g., a potentiostat) to allow the amount of current required by the voltage on the anode (and vice versa).

In an exemplary embodiment, electrorefining system 100 can be utilized in a two-phase process for the electrorefining of high-purity silicon, for example solar-grade (i.e., 99.9999% pure or above) silicon. During operation of electrorefining system 100, electrical potential is applied to anode 120 through control system 104. As electrical potential is applied, silicon is dissolved from anode 120 into electrolyte 108, along with one or more impurities. Responsive to electrical current flowing between anode 120 and cathode 110, silicon and other species dissolved from anode 120 travel through electrolyte 108 and deposit on cathode 110. Electrorefining system 100 can be configured to maintain a desired rate of dissolution from anode 120 and rate of deposition on cathode 110, for example by varying the potential difference applied between anode 120 and reference electrode 106. Alternatively, electrorefining system 100 may be configured to vary and/or modify the rate of dissolution from anode 120 and/or rate of deposition on cathode 110.

As illustrated in FIG. 1A, in certain exemplary embodiments, during the first phase of operation, control system 104 is used to maintain a desired potential difference between anode 120 and reference electrode 106. For example, it may be desirable to maintain the potential difference between anode 120 and reference electrode 106 at or below the standard oxidation potential of silicon at the operating temperature of electrorefining system 100. By maintaining a relatively low potential difference (for example, a potential difference below the oxidation potential of silicon) between anode 120 and reference electrode 106, a relatively high rate of dissolution of silicon from the anode is achieved, but the concentration of one or more impurities in electrolyte 108 is increased. After a sufficient amount of silicon has dissolved from anode 120 and/or a sufficient amount of time has passed, electrorefining system 100 can be operated in a second phase of operation.

Turning now to FIG. 1B, in various exemplary embodiments, in connection with the second phase of operation of electrorefining system 100, anode 120 is removed and second cathode 112 is inserted into vessel 102. During the second phase of operation, first cathode 110 is operated as an anode, and second cathode 112 is operated as a cathode. As electrical energy is applied to electrorefining system 100 and/or portions thereof, control system 104 is used to maintain a desired potential difference between second cathode 112 and reference electrode 106. For example, it may be desirable to maintain the potential difference between second cathode 112 and reference electrode 106 between a minimum and maximum level. In various embodiments, the minimum potential difference is the standard reduction potential of silicon at the process temperature. In various embodiments, the maximum potential difference is between about 0.0 volts and 1.0 volts more negative than the reduction potential of silicon at the process temperature. By maintaining a relatively low potential difference, the amount of impurities deposited on second cathode 112 by electrolyte 108 is maintained at a relatively low level.

In various embodiments, the maximum potential difference between second cathode 112 and reference electrode 106 is limited by the target concentration of one or more impurities. As the potential difference increases, one or more impurities in electrolyte 108 are deposited more rapidly on second cathode 112, which can increase the concentration of the one or more impurities. Therefore, it may be desirable to maintain a potential difference between second cathode 112 and reference electrode 106 between a minimum and maximum level, as described above. After a sufficient amount of high-purity silicon has deposited on the surface of second cathode 112 and/or a sufficient amount of time has passed, the second phase of operation of electrorefining system 100 can be terminated, and second cathode 112 removed for further processing.

Figure 2A:
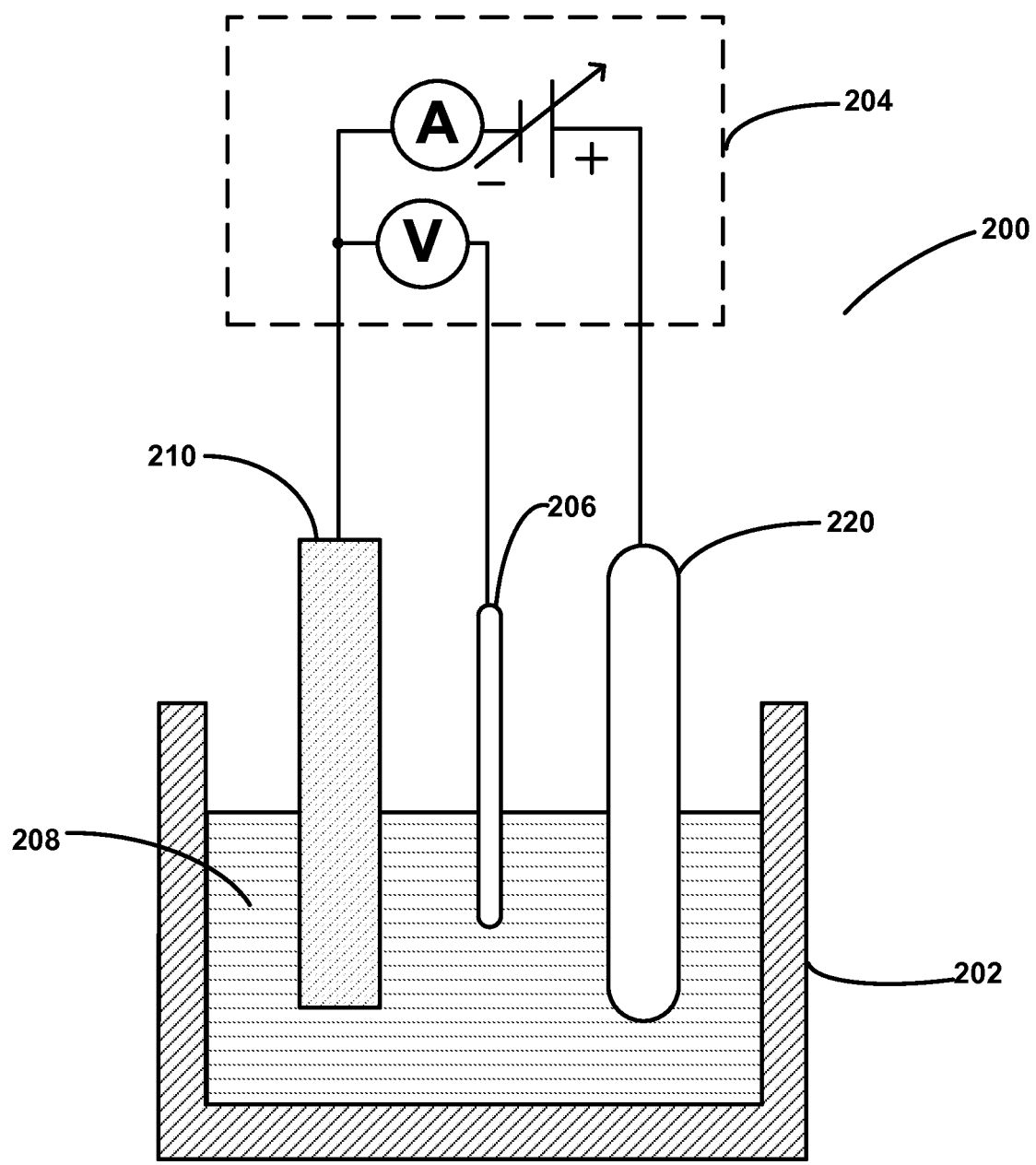
FIGS. 2A and 2B illustrate an exemplary electrorefining system in accordance with an exemplary embodiment.
Figure 2B:
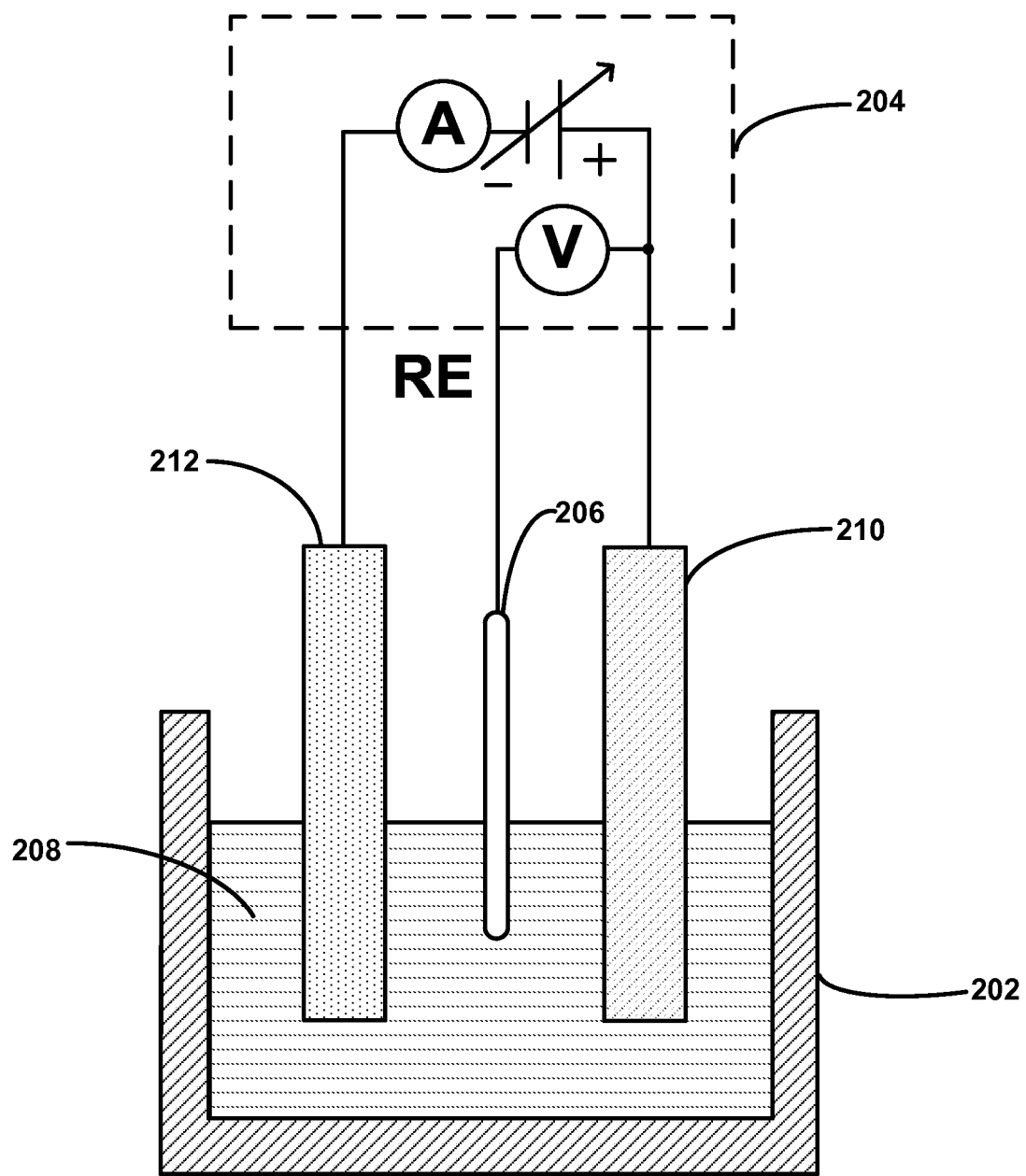

In other exemplary embodiments, and with reference now to FIGS. 2A and 2B, an electrorefining system 200 can be operated in a two-phase process to electrorefine high-purity material, for example, solar-grade silicon. FIG. 2A illustrates a first phase of operation of electrorefining system 200. During the first phase of operation, the potential difference between a cathode 210 and a reference electrode 206 is controlled by control system 204. As previously discussed in relation to the second phase of operation of electrorefining system 100, the potential difference between cathode 210 and reference electrode 206 can be maintained at a desired level to achieve a suitably high rate of deposition of silicon and a suitably low concentration of impurities on the surface of cathode 210.

FIG. 2B illustrates a second phase of operation of electrorefining system 200 in various exemplary embodiments. In connection with the second phase of operation, anode 220 is removed and second cathode 212 is inserted into vessel 202. During the second phase of operation, first cathode 210 is operated as an anode and second cathode 212 is operated as a cathode. The potential difference between first cathode 210 (operating as an anode) and reference electrode 206 is controlled by control system 204. As previously discussed in relation to the first phase of operation of electrorefining system 100, the potential difference between first cathode 210 (operating as an anode) and reference electrode 206 can be maintained at a desired level to achieve a suitably high rate of dissolution of silicon and a suitably low rate of dissolution of impurities from first cathode 210 (operating as an anode).

Figure 3A:
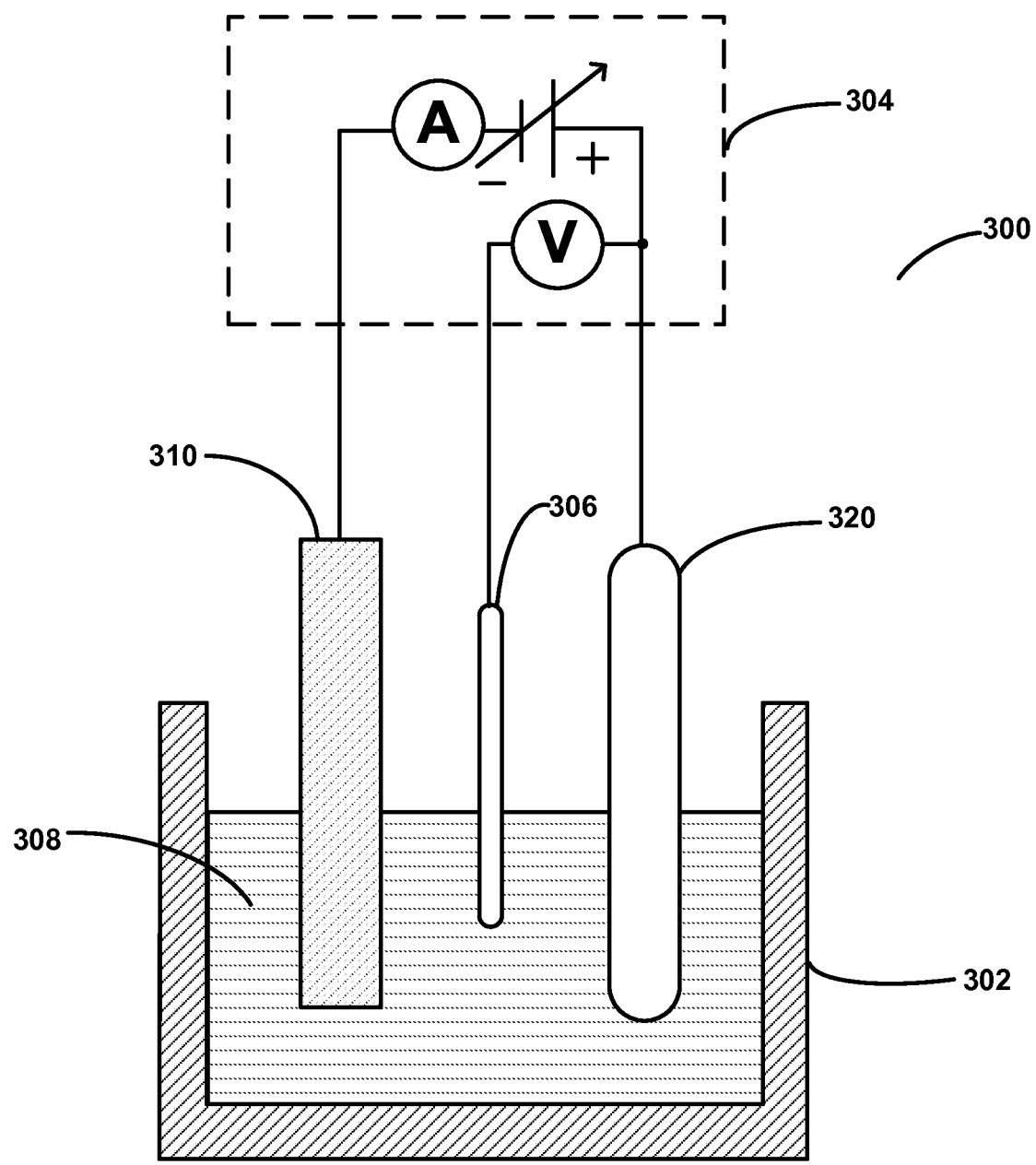
FIGS. 3A, 3B, and 3C illustrate an exemplary electrorefining system in accordance with an exemplary embodiment.
Figure 3B:
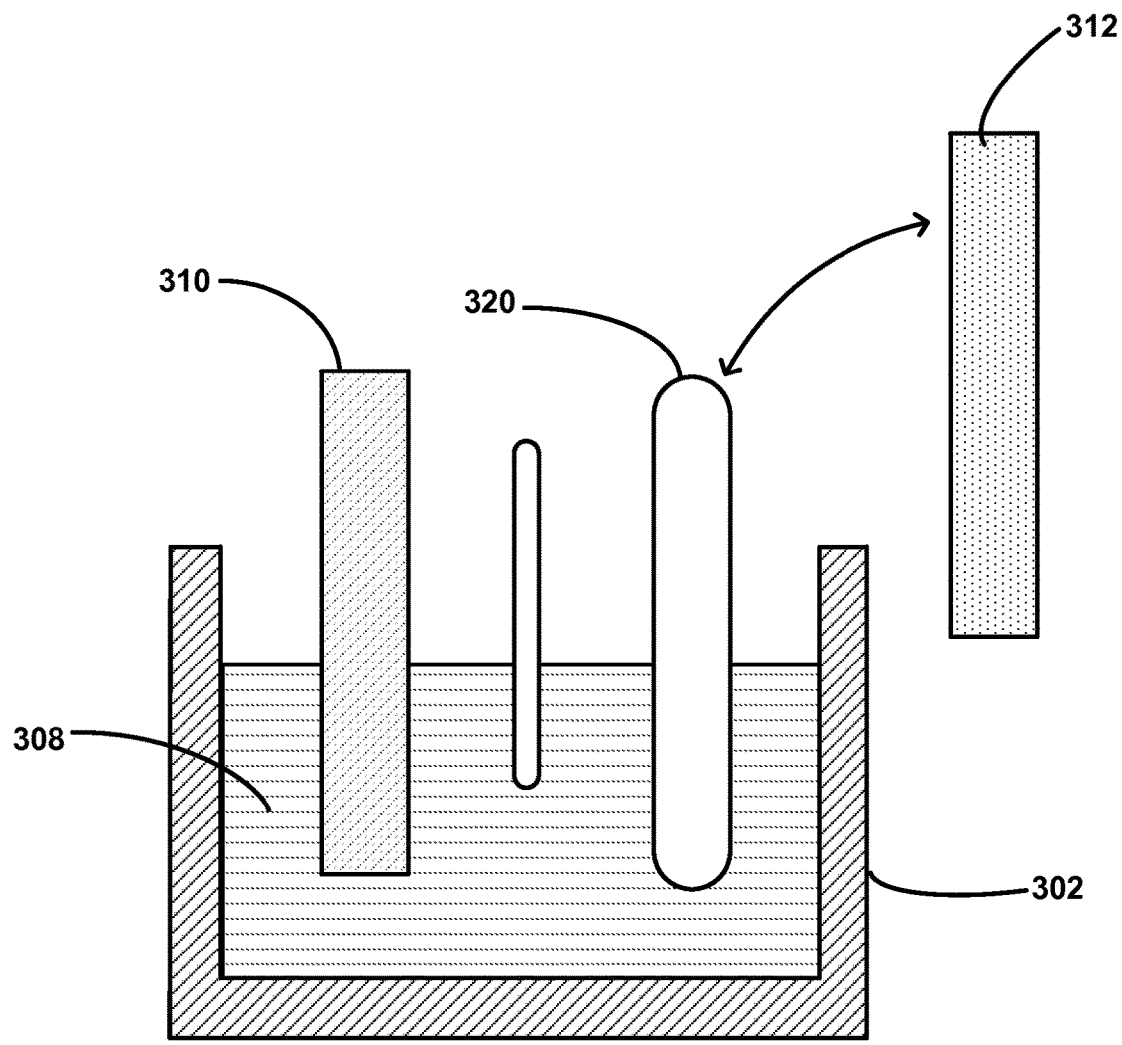
Figure 3C:
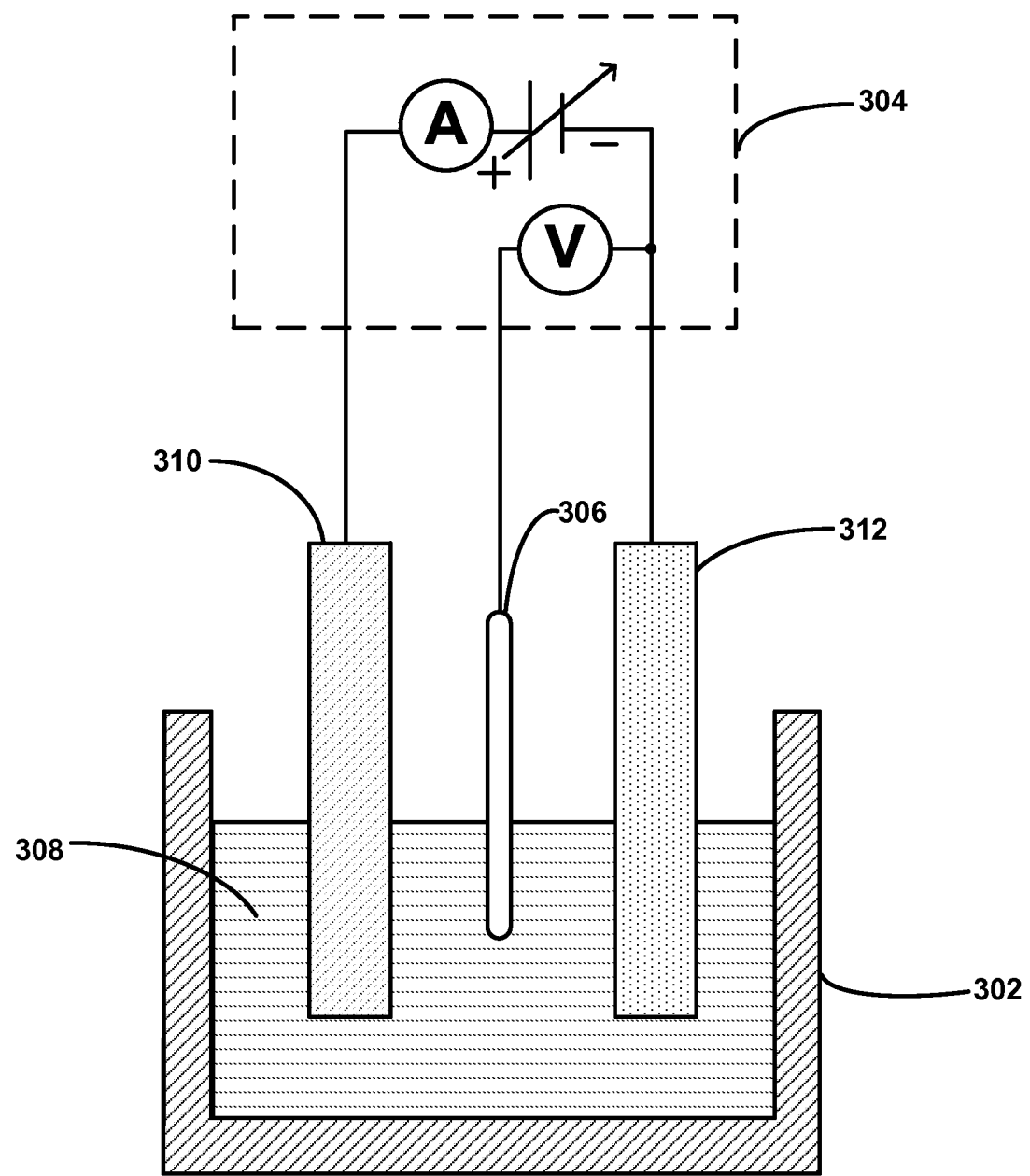

Turning now to FIGS. 3A through 3C, in various embodiments, an exemplary electrorefining system 300 can be operated in a two-phase process to electrorefine high-purity material, for example solar-grade silicon. As illustrated in FIG. 3A, during a first phase of operation, electrorefining system 300 comprises a first cathode 310 and an anode 320. During the first phase of operation, the electrical potential between anode 320 and a reference electrode 306 is controlled by a control system 304. As discussed in relation to the first phase of operation of exemplary electrorefining system 100, the potential difference between anode 320 and reference electrode 306 can be maintained at a desired level to achieve a suitably high rate of dissolution of silicon and a suitably low rate of dissolution of impurities from anode 320.

In various exemplary embodiments, after a sufficient time of operation of electrorefining system 300 in the first phase configuration (for example, after a time of operation of between about three hours and about three days), as illustrated in FIG. 3B, anode 320 is removed and second cathode 312 is inserted into vessel 302. As illustrated in FIG. 3C, during a second phase of operation, first cathode 310 is operated as an anode, and second cathode 312 is operated as a cathode. During the second phase, the potential difference between second cathode 312 and reference electrode 306 is controlled by control system 304. As previously discussed in relation to the second phase of operation of electrorefining system 100, the potential difference between second cathode 312 and reference electrode 306 can be maintained at a desired level to achieve a suitably high rate of deposition of silicon and a suitably low concentration of impurities on the surface of second cathode 312. Such a two-phase operation allows for the use of a single electrorefining system 300 to subject the silicon of anode 320 to two stages of dissolution and deposition, which can improve the quality of silicon ultimately deposited on the surface of second cathode 312 by, for example, minimizing the concentration of one or more impurities.

Figure 4A:
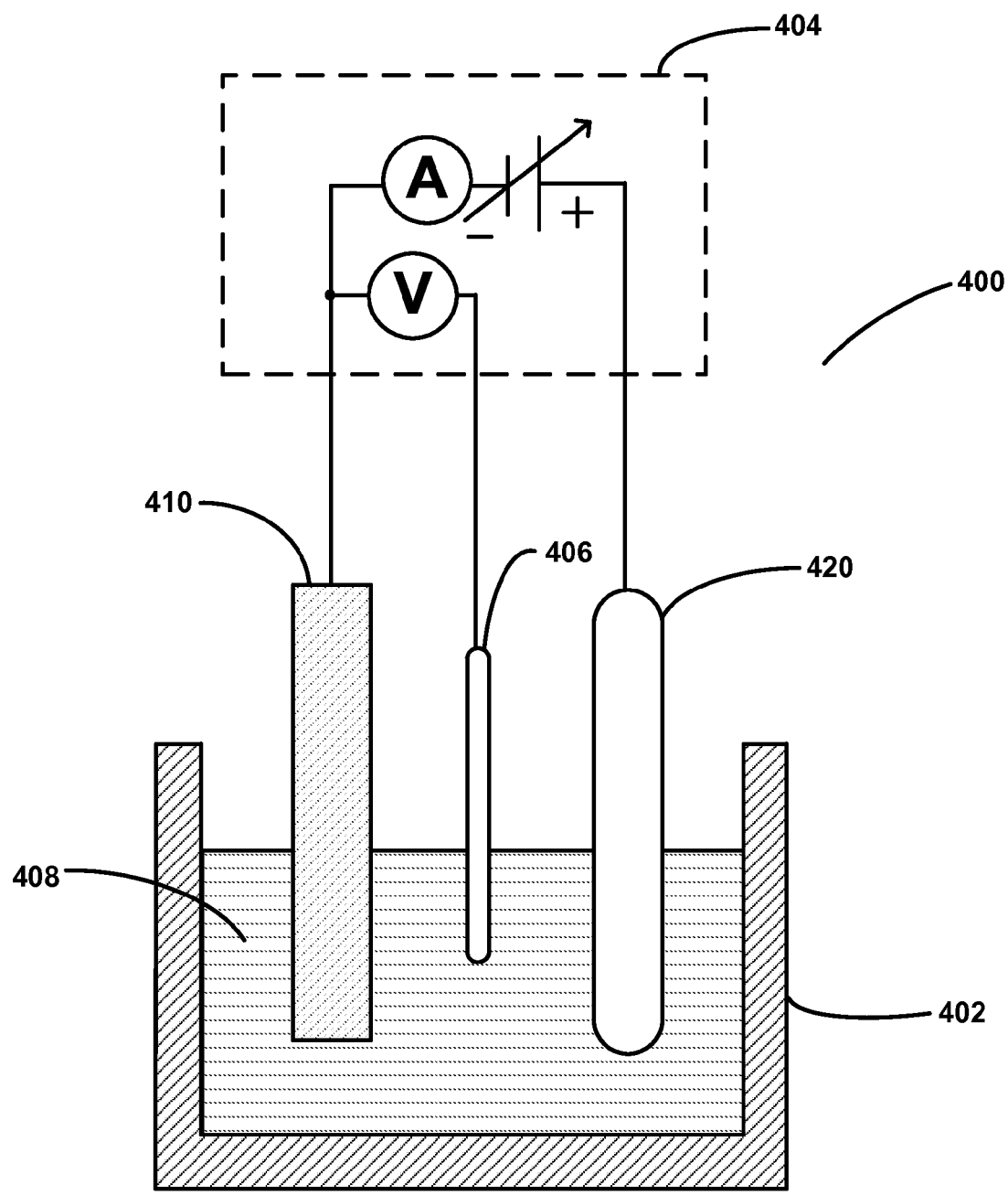
FIGS. 4A, 4B, and 4C illustrate an exemplary electrorefining system in accordance with an exemplary embodiment.
Figure 4B:
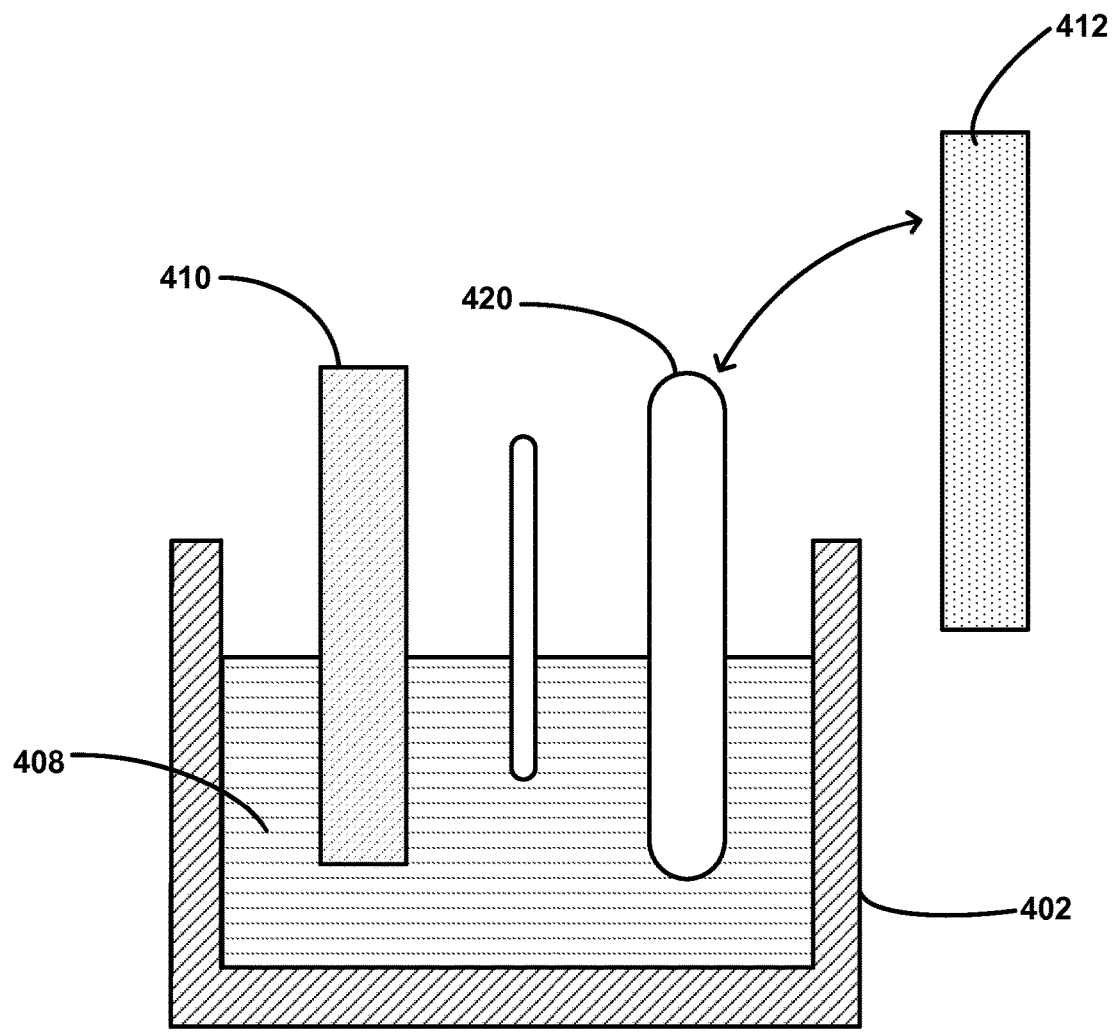
Figure 4C:
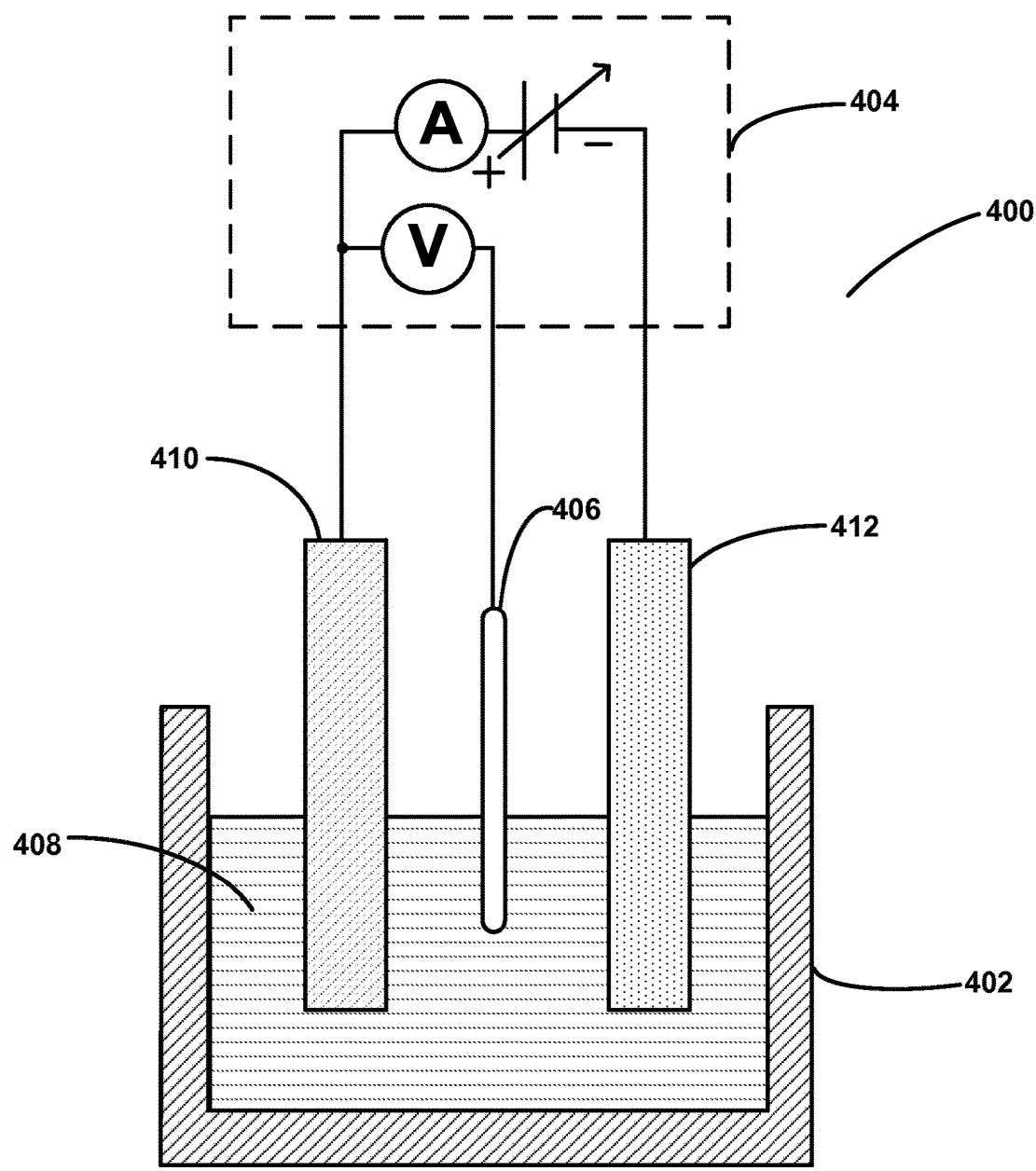

In other exemplary embodiments, and with reference now to FIGS. 4A through 4C, an exemplary electrorefining system 400 can be operated in a two-phase process to electrorefine high-purity material, for example solar-grade silicon. As illustrated in FIG. 4A, during a first phase of operation, electrorefining system 400 comprises a first cathode 410 and an anode 420. During the first phase of operation, the potential difference between first cathode 410 and a reference electrode 406 is controlled by a control system 404. As discussed in relation to the second phase of operation of exemplary electrorefining system 100, the potential difference between first cathode 410 and reference electrode 406 can be maintained at a desired level to achieve a suitably high rate of deposition of silicon and a suitably low rate of deposition of impurities on the surface of first cathode 410.

In various exemplary embodiments, after a sufficient time of operation of electrorefining system 400 in the first phase configuration, as illustrated in FIG. 4B, anode 420 is removed and second cathode 412 is inserted into vessel 402. As illustrated in FIG. 4C, during a second phase of operation, first cathode 410 is operated as an anode and the potential difference between first cathode 410 (operating as an anode) and reference electrode 406 is controlled by control system 404. As previously discussed in relation to the first phase of operation of electrorefining system 100, the potential difference between first cathode 410 (operating as an anode) and reference electrode 406 can be maintained at a desired level to achieve a suitably high rate of dissolution of silicon and a suitably low dissolution rate of impurities from first cathode 410 (operating as an anode). Such a two-phase operation allows for the use of a single electrorefining system 400 to subject the silicon of anode 420 to two stages of dissolution and deposition, which can improve the quality of silicon ultimately deposited on the surface of second cathode 412 by, for example, minimizing the concentration of one or more impurities.

Figure 5:
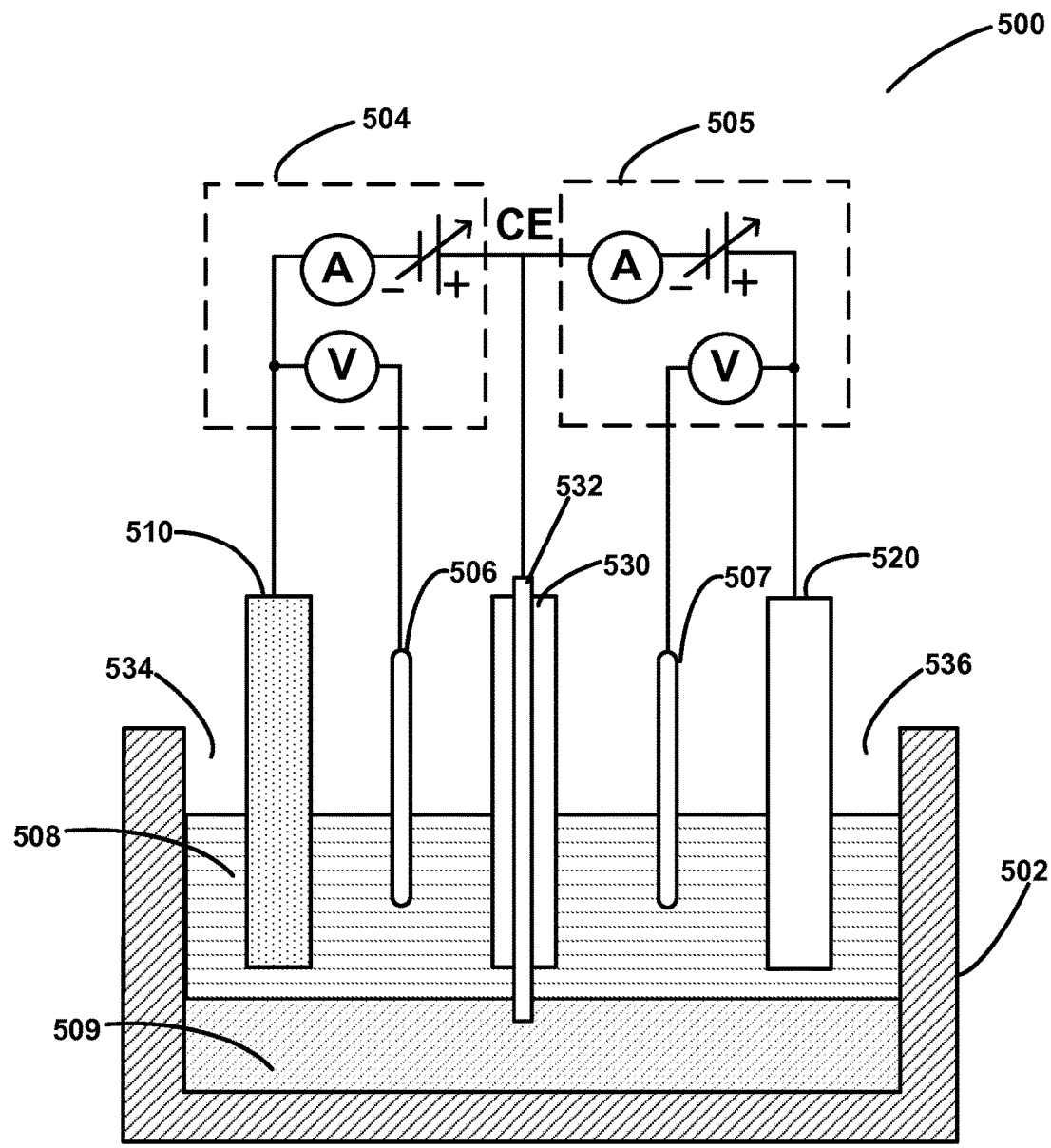
FIG. 5 illustrates an exemplary electrorefining system in accordance with an exemplary embodiment.

In various exemplary embodiments and with reference now to FIG. 5, an electrorefining system 500 comprising a first control system 504 and a second control system 505 can be operated in a single-phase process for electrorefining of high-purity silicon. In such configurations, first control system 504 can comprise a potentiostat configured to maintain a potential difference between a first reference electrode 506 and a cathode 510.

Second control system 505 can comprise, for example, a potentiostat configured to maintain a potential difference between a second reference electrode 507 and anode 520. In an exemplary embodiment, second control system 505 maintains the electrical potential between second reference electrode 507 and the electrode not controlled by first control system 504.

In various embodiments, electrorefining system 500 further comprises a partition 530. For example, partition 530 can comprise a non-conductive material which separates an electrolyte 508 into a cathode segment 534 and an anode segment 536. In such embodiments, partition 530 maintains physical isolation between cathode segment 534 and anode segment 536.

Electrorefining system 500 can further comprise a counter electrode 532 and a molten alloy 509. In such embodiments, a portion of counter electrode 532 is in contact with molten alloy 509. A surface of molten alloy 509 can be in contact with a surface of electrolyte 508 of cathode segment 534 and anode segment 536. In such configurations, molten alloy 509 operates as a cathode for anode segment 536 and as an anode for cathode segment 534.

In various exemplary electrorefining processes, electrorefining system 500 is operated such that a first electrical current flows between anode 520 and counter electrode 532, and a second electrical current flows between cathode 510 and counter electrode 532. In an exemplary embodiment, control system 504 is configured to maintain a desired potential difference between cathode 510 and reference electrode 506. Such a desired potential difference can comprise a potential difference which achieves a suitably high rate of deposition of silicon and a suitably low rate of deposition of impurities on the surface of cathode 510. In such embodiments, control system 505 is configured to maintain a desired potential difference between anode 520 and reference electrode 507. Such a desired potential difference can comprise a potential difference which achieves a suitably high rate of dissolution of silicon and a suitably low rate of dissolution of impurities from anode 520. Separately controlling these two potential differences can be beneficial by, for example, achieving low impurity concentrations in the production of high-purity silicon.

Thus, the various systems and methods of electrorefining of the present disclosure provide means to produce sufficiently high-purity materials, for example silicon. The improved control of operating conditions, such as operating temperatures and various potential differences, beneficially increases the purity of electrorefined materials, for example solar-grade silicon.

The present disclosure has been described above with reference to a number of exemplary embodiments. It should be appreciated that the particular embodiments shown and described herein are illustrative of inventive principles and its best mode and are not intended to limit in any way the scope of the present disclosure. Those skilled in the art having read this disclosure will recognize that changes and modifications may be made to the exemplary embodiments without departing from the scope of the present disclosure. Various aspects and embodiments of the present disclosure may be applied to fields of use other than electrorefining of silicon. Although certain aspects of the present disclosure are described herein in terms of exemplary embodiments, such aspects may be achieved through any number of suitable means now known or hereafter devised. Accordingly, these and other changes or modifications are intended to be included within the scope of the present disclosure.

While steps outlined herein represent exemplary embodiments of principles of the present disclosure, practitioners will appreciate that there are other steps that may be applied to create similar results. The steps are presented for the sake of explanation only and are not intended to limit the scope of the present disclosure in any way. Benefits, other advantages, and solutions to problems have been described herein with regard to specific embodiments. However, the benefits, advantages, solutions to problems, and any element(s) that may cause any benefit, advantage, or solution to occur or become more pronounced are not to be construed as critical, required, or essential features or elements of any or all of the claims.

In the detailed description herein, references to "various embodiments", "one embodiment", "an embodiment", "an example embodiment", "an exemplary embodiment" etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to utilize such feature, structure, or characteristic in connection with other embodiments if suitable, whether or not explicitly described. After reading the description, it will be apparent to one skilled in the relevant art(s) how to implement principles of the disclosure in alternative embodiments.

It should be understood that the detailed description and specific examples, indicating exemplary embodiments, are given for purposes of illustration only and not as limitations. Many changes and modifications may be made without departing from the spirit thereof, and principles of the present disclosure include all such modifications. Corresponding structures, materials, acts, and equivalents of all elements are intended to include any structure, material, or acts for performing the functions in combination with other elements. Reference to an element in the singular is not intended to mean "one and only one" unless explicitly so stated, but rather "one or more." Moreover, when a phrase similar to "at least one of A, B, or C" or "at least one of A, B, and C" is used in the claims or the specification, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

The invention claimed is:

1. A method for electrorefining of silicon, the method comprising:

applying a first electrical potential to a silicon-containing anode with respect to a reference electrode and a first electrical current between the anode and a first cathode to cause silicon to dissolve from the anode into a molten electrolyte and to cause silicon to deposit from the molten electrolyte onto the first cathode, the molten electrolyte coupling the anode, the first cathode, and the reference electrode;

decoupling the anode from the molten electrolyte;

coupling a second cathode to the molten electrolyte; and applying a second electrical potential to the second cathode with respect to the reference electrode and a second electrical current between the first cathode and the second cathode to cause silicon to dissolve from the first cathode into the molten electrolyte to cause silicon to deposit from the molten electrolyte directly onto the second cathode.

2. The method of claim 1, wherein the first electrical potential and the second electrical potential are different.

3. The method of claim 1, wherein the second electrical potential is between: (i) the reduction potential of silicon at a process temperature, and (ii) 1.0 volts more negative than the reduction potential of silicon at the process temperature.

4. The method of claim 3, wherein the process temperature is between 600 degrees Celsius and 1500 degrees Celsius.

5. The method of claim 1, wherein the silicon deposited onto the second cathode has purity in excess of 99,9999%.

6. The method of claim 1, wherein the silicon deposited onto the second cathode has a higher purity than the silicon deposited on the first cathode.

7. The method of claim 1, wherein the electrolyte comprises at least one of calcium chloride ($CaCl_2$), lithium flouride (LiF), or lithium chloride (LiCl).

8. The method of claim 1, wherein at least one of the first electrical potential or the second electrical potential is controlled by a potentiostat.

9. The method of claim 1, wherein the anode comprises metallurgical grade silicon.

10. The method of claim 1, wherein the reference electrode comprises at least one of glassy carbon or platinum.

11. The method of claim 1, wherein the applying the first electrical potential extends for a period of time between three hours and three days.

* * * * *